United States Patent
Kim et al.

(10) Patent No.: US 7,349,245 B2
(45) Date of Patent: Mar. 25, 2008

(54) NON-VOLATILE PHASE-CHANGE MEMORY DEVICE AND ASSOCIATED PROGRAM-SUSPEND-READ OPERATION

(75) Inventors: Hye-jin Kim, Seoul (KR); Kwang-jin Lee, Hwaseong-si (KR); Sang-Beom Kang, Hwaseong-si (KR); Mu-hui Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/486,100

(22) Filed: Jul. 14, 2006

(65) Prior Publication Data

US 2007/0217253 A1    Sep. 20, 2007

(30) Foreign Application Priority Data

Mar. 16, 2006   (KR) ...................... 10-2006-0024328

(51) Int. Cl.
  *G11C 11/00* (2006.01)
  *G11C 11/14* (2006.01)
(52) U.S. Cl. ........................ 365/158; 365/171; 365/173
(58) Field of Classification Search ................ 365/158, 365/171, 173, 175, 185.11, 185.23, 185.28
See application file for complete search history.

(56) References Cited

U.S. PATENT DOCUMENTS

| 5,287,469 | A |   | 2/1994  | Tsuboi |
| 5,822,244 | A |   | 10/1998 | Hansen et al. |
| 6,016,270 | A | * | 1/2000  | Thummalapally et al. ............... 365/185.11 |
| 6,134,180 | A |   | 10/2000 | Kim et al. |
| 6,707,712 | B2 | * | 3/2004 | Lowery ..................... 365/175 |
| 6,754,107 | B2 |   | 6/2004 | Khouri et al. |
| 6,930,925 | B2 | * | 8/2005 | Guo et al. ............. 365/185.28 |
| 2004/0246808 | A1 | | 12/2004 | Cho et al. |
| 2005/0024922 | A1 | | 2/2005 | Li et al. |

FOREIGN PATENT DOCUMENTS

| KR | 1020000001436 A | 1/2000 |
| KR | 1020060004289 A | 1/2006 |

\* cited by examiner

*Primary Examiner*—Trong Phan
(74) *Attorney, Agent, or Firm*—Volentine & Whitt, PLLC

(57) ABSTRACT

A method of performing a program-suspend-read operation in a PRAM device comprises programming a write block comprising N unit program blocks in response to a program operation request, and suspending the program operation after programming M unit program blocks, where M is less than N, in response to a read operation request. The method further comprises executing the requested read operation, and then resuming the programming of the write data block and programming (N−M) remaining unit program blocks.

42 Claims, 15 Drawing Sheets

NON-VOLATILE PHASE-CHANGE MEMORY DEVICE AND ASSOCIATED PROGRAM-SUSPEND-READ OPERATION

BACKGROUND OF THE INVENTION

1. Field of the Invention

Embodiments of the invention relate generally to non-volatile semiconductor memory devices. More particularly, embodiments of the invention relate to non-volatile semiconductor memory devices including phase-change memory cells.

This application claims priority to Korean Patent Application No. 10-2006-0024328, filed on Mar. 16, 2006, the subject matter of which is hereby incorporated by reference in its entirety.

2. Description of the Related Art

Non-volatile memories can be found in a wide variety of consumer and industrial electronic devices such as cellular phones, personal computers, cameras, and personal digital assistants, to name but a few. An important property of non-volatile memories is their ability to retain stored data when disconnected from a power source. This property allows the non-volatile memories to conserve power, and it also reduces the risk of data loss in the event of unanticipated power failure.

Perhaps the most common form of non-volatile memory currently is flash memory. Flash memory is a popular choice for auxiliary memories of portable electronic devices for a variety of reasons, including its non-volatile properties, speed, high degree of integration, and high tolerance to physical shock.

Compared with other forms of memory such as dynamic random access memory (DRAM), flash memory has similar read times, but significantly slower write times. For example, a typical read time for a flash memory cell varies between 20 and 120 ns, while a typical read time for a DRAM cell is about 50 ns. On the other hand, a typical write time for a flash memory cell is greater than 1 µs, while a typical write time for a DRAM cell is about 50 ns.

Another difference between flash memory and other forms of memory is its endurance. On average, a flash memory cell can only be erased or rewritten on the order of $10^5$ times before the cell fails. In contrast, DRAM cells can be erased or rewritten on the order of $10^{15}$ times without failure.

Because of flash memory's relatively long write times and low endurance, researchers have looked to alternative technologies for next generation non-volatile memories. Among the more promising alternatives, there are ferroelectric random access memory (FeRAM), magnetoresistive random access memory (MRAM), and Phase-Change Random Access Memory (PRAM). Each of these alternatives tends to have read and write times less than 100 ns and endurance on the order of $10^{13}$ or greater. In addition, each of the above alternatives tends to have a lower operating current than flash memory.

A PRAM, also known as an Ovonic Unified Memory (OUM), includes a phase-change material such as a chalcogenide alloy which is responsive to energy (e.g., thermal energy) so as to be stably transformed between crystalline and amorphous states. Such a PRAM is disclosed, for example, in U.S. Pat. Nos. 6,487,113 and 6,480,438.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

The speed and stability of the phase-change characteristics of the phase-change material are critical to the performance characteristics of the PRAM. As suggested above, chalcogenide alloys have been found to have suitable phase-change characteristics, and in particular, a compound including germanium (Ge), antimony (Sb) and tellurium (Te) (e.g., $Ge_2Sb_2Te_5$ or GST) exhibits a stable and high speed transformation between amorphous and crystalline states.

Figures (FIGS.). 1A and 1B illustrate a memory cell 10 in a 'set' state and in a 'reset' state, respectively. In this example, the memory cell 10 includes a phase-change resistive element 11 and a transistor 19 connected in series between a bit line BL and a reference potential (e.g., ground), with the transistor 19 being gated to a word line WL. A more simplified diagram of memory cell 10 is shown for example, in FIG. 2. It should be noted that FIGS. 1A, 1B, and 2 are general schematic views only, that the configuration of phase-change resistive element 11 is presented as an example only, and that other configurations and connections with respect to phase-change resistive element 11 are possible. For example, phase-change resistive element 11 may instead be connected in series with a diode 32 between bit line BL and word line WL, as shown in FIG. 3.

The memory cell shown in FIG. 2 is generally referred to as a metal oxide semiconductor (MOS) type PRAM cell, and the memory cell shown in FIG. 3 is generally referred to as a diode-type PRAM cell. Differences between the MOS type PRAM cell and the diode type PRAM cell include, for example, the cell size and required driving current. The diode type PRAM cell is generally smaller, and requires a higher driving current than the MOS type PRAM cell.

In each of FIGS. 1A and 1B, phase-change resistive element 11 includes a top electrode 12 formed on a phase-change material 14. In this example, top electrode 12 is electrically connected to a bit line BL of a PRAM memory array (not shown). A conductive bottom electrode contact (BEC) 16 is formed between phase-change material 14 and a conductive bottom electrode 18. Access transistor 19 is electrically connected between bottom electrode 18 and the reference potential. As already suggested, the gate of access transistor 19 is electrically connected to word line WL of the PRAM cell array (not shown).

In FIG. 1A, phase-change material 14 is illustrated as being in its crystalline state. As described previously, this means that memory cell 10 is in a low-resistance 'set' state or logic '0' state. In FIG. 1B, a portion of phase-change material 14 is illustrated as being amorphous. Again, this means that memory cell 10 is in a high-resistance 'reset' state or logic '1' state.

The set and reset states of memory cell 10 of FIGS. 1A and 1B are established by controlling the magnitude and duration of current flow through BEC 16. That is, phase-change resistive element 11 is activated (or accessed) by operation of access transistor 19 which is responsive to a voltage of word line WL. When activated, memory cell 10 is programmed according to the voltage of bit line BL. The voltage of bit line BL is controlled to establish a programming current ICELL which causes BEC 16 to act as a resistive heater which selectively programs phase-change material 14 in its 'set' and 'reset' states.

FIG. 4 illustrates an example of temperature pulse characteristics of phase-change material as the phase-change material is programmed in the 'set' and 'reset' states. In particular, reference number 41 denotes the temperature pulse of the phase-change material programmed to its 'reset' state, and reference number 42 denotes the temperature pulse of the phase-change material programmed to its 'set' state.

As shown in FIG. 4, when the phase-change material is programmed to its 'reset' state, the temperature of the material is increased above its melting temperature Tm (e.g., 610° C.) for a relatively short period of time, and then allowed to rapidly cool. In contrast, when the phase-change material is programmed to its 'set' state, the temperature of the material is increased to below its melting point Tm and above its crystallizing temperature Tx (e.g., 450° C.) for a longer period of time, and then allowed to cool more slowly. The fast and slow cooling of the 'reset' and 'set' programming operations are referred to in the art as fast "quenching" and slow "quenching", respectively. The temperature range between the melting temperature Tm and the crystallizing temperature Tx is referred to as the "set window."

FIG. 5 is a graph illustrating the resistive characteristic (current versus voltage) of a phase-change material for each of its 'set' and 'reset' states. In particular, line 51 is representative of the resistive characteristic of a phase-change material in its 'set' state, and line 52 is representative of the same in its 'reset' state. As shown, the set and reset resistances differ substantially below a threshold voltage (e.g., 1v), but become substantially equal to one another above the threshold voltage. In order to maintain the necessary sensing margin during reading operations, it is necessary to restrict the voltage of bit line BL to a region below the voltage threshold. As explained below with reference to FIG. 6, a clamping transistor inserted in bit line BL may be used for this purpose.

FIG. 6 is a simplified circuit diagram for explaining write and read operations of the phase-change memory cell. As shown, a bit line BL is coupled to a write driver 63 and a read circuit 64. Also connected to bit line BL are phase-change memory cell 10, a pre-charge transistor 61, and a select transistor 62.

In this example, phase-change memory cell 10 includes a phase-change element and transistor connected in series between the bit line BL and a reference potential (e.g., ground), where the transistor is gated to a word line WL. As suggested previously, other configurations of the phase-change memory cell 10 are possible. For example, phase-change memory cell 10 may instead include a phase-change memory element and diode connected between bit line BL and word line WL.

As those skilled in the art will appreciate, precharge transistor 61 (gated to a precharge control signal PREBL) is used to precharge bit line BL in a read and/or write operation, while select transistor 62 (gated to a y-address signal YSEL) is used to activate bit line BL.

Write driver 63 typically includes a current mirror 65 for applying either a reset current RESET or a set current SET as a write current $i_{write}$ to bit line BL during a write operation. Reset current RESET and set current SET were discussed previously in connection with FIG. 4.

Read circuit 64 is functional in a read operation to apply a read current tread from a current source READ to bit line BL. A clamping transistor 66, which is gated to a clamp control signal $V_{CLAMP}$, restricts bit line BL voltage to a region below the voltage threshold discussed above in connection with FIG. 5. A sense-amplifier S/A compares the voltage of bit line BL with a reference voltage $V_{REF}$, and outputs the comparison result as output data OUT.

As with other types of non-volatile memory devices, there are a variety of ways to organize and operate phase-change memory cells and associated circuitry within a PRAM memory architecture to improve overall system performance. One technique, which is commonly used in NOR flash memories, is known as a read-while-write (RWW) memory. A RWW memory comprises a memory array divided into one or more banks, where each bank has its own set of sense amplifiers and functions like an independent chip. For example, data can be read from one bank while data is being written to another bank.

FIG. 7 shows an exemplary RWW memory comprising a memory array 70 divided into four (4) banks BANK0 through BANK3,where each one of the four banks BANK0 through BANK3 includes (8) eight blocks, BLOCK0 through BLOCK7. The simultaneous read-while-write capability of the RWW memory can be advantageously used, for example, by storing frequently read data such as program code in one bank while reserving space in another memory bank for temporary data storage. No I/O interfaces for memory array 70 are shown in FIG. 7; however, RWW memories generally have the same pinout as a conventional NOR flash memory.

As shown in FIG. 7, each bank comprises a plurality of blocks, where each block comprises a plurality of memory cells. In a typical RWW memory, data is read or programmed in units of multiple memory cells. For example, in a RWW NOR flash memory, data is read or programmed in units of bytes or words, and erased an entire block at a time.

Although RWW memories allow data to be read from one bank while data is written to another bank, simultaneous read and write operations cannot be performed on the same bank. In flash memory devices, this creates a serious performance problem because the time it takes to write data to a flash memory cell tends to be significantly larger than the time it takes read data from a flash memory cell. As a result, a read operation for one address in a bank may be substantially delayed while waiting for a write operation to another address in the same bank to finish.

To address this problem, researchers have developed a technique for temporarily suspending a write operation in a flash memory to allow a read operation to proceed without substantial delay. This technique is referred to as a write-suspend-read, or program-suspend-read operation. FIG. 8 is a waveform timing diagram illustrating one way to perform a write-suspend-read operation in a flash memory cell.

Referring to FIG. 8, a program signal PGM indicates a time $t_{PGM}$ required to program a flash memory cell, or a unit program block write period. For instance, program signal PGM could be a program voltage applied to the flash memory cell while it is being programmed. In the absence of an intervening read operation, the program operation is performed in one continuous interval, as indicated by the waveform labeled "normal write timing" in FIG. 8. However, where there is an intervening read operation for another address in the same bank as the flash memory cell being programmed, a suspend signal PGM_SUSPEND is asserted, causing the program operation to be temporarily suspended after a time $t_{PGM\_PRE}$. The read operation is then executed, and then following the read operation, a resume signal PGM_RESUME is asserted, causing the program operation to continue for a time $t_{PGM}$-$t_{PGM\_PRE}$. The timing for program signal PGM when there is an intervening read operation is shown by a waveform labeled "Write suspend/resume timing" in FIG. 8.

Even when the program operation is interrupted as illustrated in FIG. 8 the total time required to perform the program operation does not change. In other words, the flash cell is programmed according to the cumulative time that program signal PGM is asserted before and after the read operation.

Various flash memory cells allowing a read operation to interrupt a program interruption are disclosed, for example, in U.S. Pat. No. 5,287,469 to Tsuboi, U.S. Pat. No. 5,822,244 to Hansen et al., and U.S. Pat. No. 6,930,925 to Guo et al.

Like flash memory cells, phase-change memory cells can generally be read much faster than they can be programmed (i.e., "set" or "reset"). Accordingly, it may be advantageous to interrupt a program operation to one address in a bank of a phase-change memory cell in order to perform a read operation from another address in the same bank. However, unlike flash memory cells, programming of a phase-change memory cell must start over from the beginning after an interruption occurs. In other words, the time that a phase-change material is heated, as illustrated by the temperature pulse characteristics of FIG. 4, does not accumulate across interruptions.

Also unlike flash memory cells, an entire block of phase-change memory cells generally cannot be programmed or erased at the same time. Simultaneously programming or erasing an entire block of phase-change memory cells requires an untenably large drive current. Accordingly, a block of phase-change memory cells is typically programmed sequentially by applying a series of program pulses to the respective cells.

Because phase-change memory cells have different programming requirements than conventional flash memory cells, the techniques commonly used to operate-flash memory devices are simply not applicable to operation of a PRAM device.

SUMMARY OF THE INVENTION

In recognition of several unique aspects of PRAM devices, embodiments of the invention provide efficient methods for performing a program-suspend-read operation on a PRAM device without significantly affecting the endurance or the power consumption of the device.

According to one embodiment of the invention, PRAM operating method is provided. The method comprises programming a write data block comprising N unit program blocks in response to a program operation request, and suspending the program operation after programming M unit program blocks, where M is less than N, in response to a read operation request. The method further comprises executing the requested read operation, and resuming the programming of the write data block and programming (N−M) remaining unit program blocks.

According to another embodiment of the invention, a method of executing a program operation in PRAM is provided. The method comprises programming phase-change memory cells on a unit program block by unit program block basis in response to a sequence of program pulses gated by a counter signal. The counter signal is suspended by a read operation request and resumed upon completion of the requested read operation.

According to yet another embodiment of the invention, a PRAM is provided. The PRAM comprises a memory cell array comprising a plurality of phase-change memory cells programmed by a write current. The PRAM further comprises a write driver circuit adapted to generate the write current and apply the write current to selected ones of the plurality of phase-change memory cells in response to a sequence of program pulses, and a program pulse generator adapted to generate the sequence of program pulses in response to a counter signal. The PRAM still further comprises a counter adapted to provide the counter signal during a program operation, suspend provision of the counter signal during a read operation interrupting the program operation, and resume provision of the counter signal upon completion of the interrupting read operation.

According to still another embodiment of the invention, a system including a PRAM device is provided. The system comprises a microprocessor receiving input data from an I/O circuit and storing the input data in a non-volatile memory system. The memory system comprises a memory cell array comprising a plurality of phase-change memory cells programmed by a write current, a write driver circuit adapted to generate the write current and apply the write current to selected ones of the plurality of phase-change memory cells in response to a sequence of program pulses, a program pulse generator adapted to generate the sequence of program pulses in response to a counter signal, and a counter adapted to provide the counter signal during a program operation, suspend provision of the counter signal during a read operation interrupting the program operation, and resume provision of the counter signal upon completion of the interrupting read operation.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

In general, embodiments of the invention relate to PRAM devices and associated methods of operation. More particularly, several embodiments of the invention provide PRAM devices and associated methods for performing a program-suspend-read operation.

The terms "write" and "program" are used interchangeably in this written description to denote operations for storing data in one or more phase-change memory cells of a PRAM device. The term "write data block" refers to one or more phase-change memory cells where data is stored by a write or program operation. A write data block is generally divided into a plurality of "unit program blocks," where each one of the unit program blocks includes the same number of memory cells, or in other words, has the same "unit program block size." For example, a write data block comprising a row of sixteen (16) phase-change memory cells may include four (4) unit program blocks, each comprising four (4) memory cells. Alternatively, the write data block including sixteen phase-change memory cells could comprise eight (8) unit program blocks, each comprising two (2) memory cells.

A unit program block is programmed during an uninterrupted time interval denoted a "unit program block write period." Within each unit program block write period, the phase-change memory cells of the corresponding unit program block are programmed in response to a sequence of program pulses generated in response to a counter signal. The counter signal is suspended by a read operation request and resumed upon completion of the requested read operation. Accordingly, the sequence of program pulses is also suspended during the requested read operation and resumed upon completion of the requested read operation.

Figure 1A:
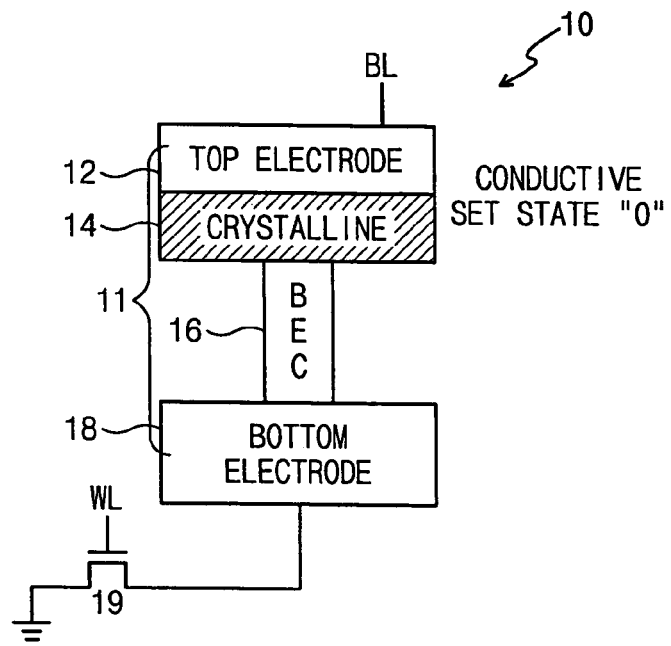
FIGS. 1A and 1B are schematic views of a phase-change memory cell in a set state and a reset state, respectively.
Figure 1B:
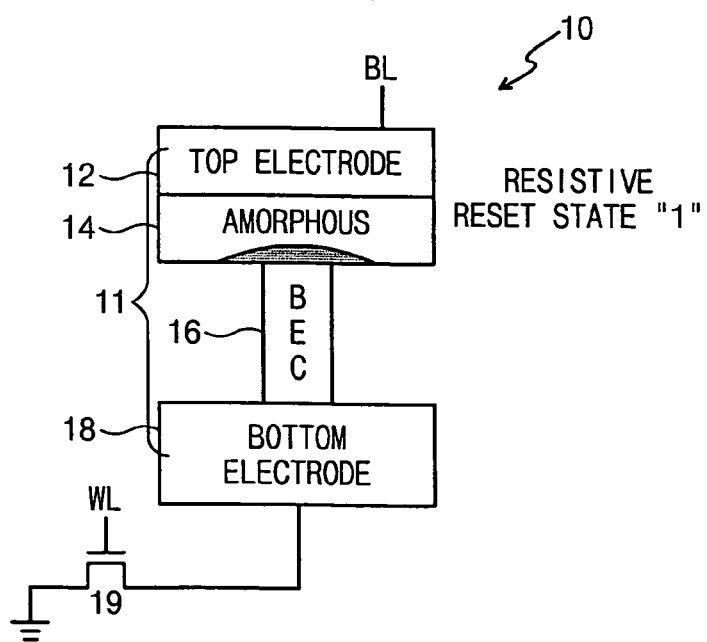
Figure 2:
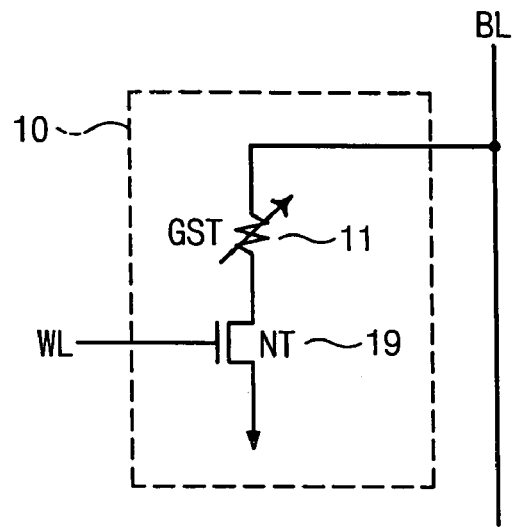
FIG. 2 is a circuit diagram of a MOS-type phase-change memory cell.
Figure 3:
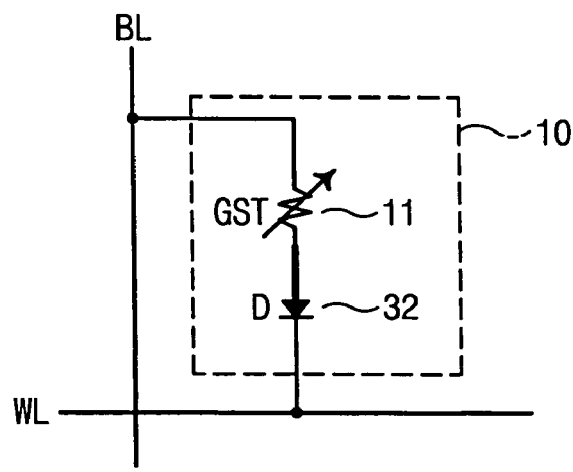
FIG. 3 is a circuit diagram of a diode-type phase-change memory cell.
Figure 4:
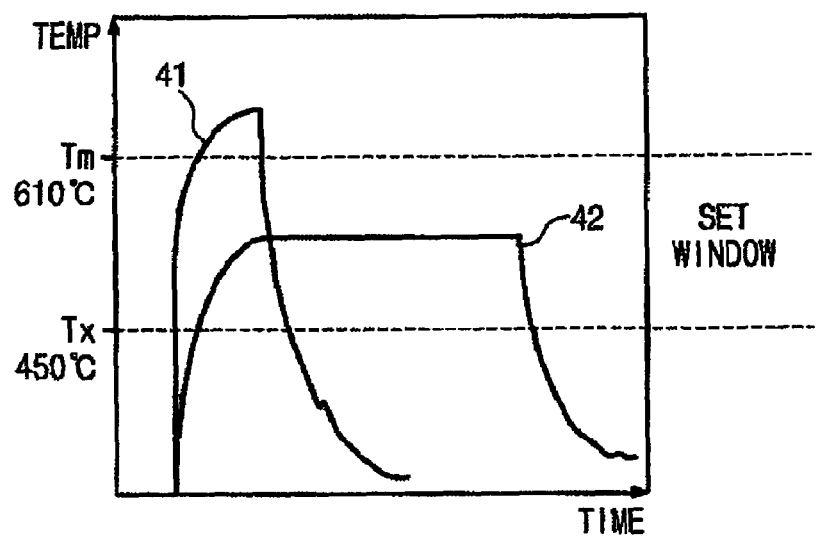
FIG. 4 is a graph showing temperature characteristics during programming of a phase-change memory cell.

The term "program pulse" denotes an electrical current pulse causing a phase-change memory cell to become programmed, i.e., to assume the "set" or "reset" state. In particular, the term "reset pulse" denotes a program pulse causing a phase-change memory cell to assume the reset state, and the term "set pulse" denotes a program pulse causing a phase-change memory cell to assume the set state. In general, the duration and magnitude of the reset and set pulses are related to the duration and magnitude of corresponding temperature pulse characteristics of an associated phase-change memory cell such as those illustrated in FIG. 4.

A program pulse is typically applied either directly to a phase-change memory cell, or to a write driver circuit generating a write current to program the memory cell.

Although an entire write data block of phase-change memory cells are generally not programmed at the same time due to the large write current required, more than one phase-memory cell within a write data block can be usually be programmed at the same time. For example, two (2) or four (4) memory cells are often programmed within a common time interval.

Figure 9:
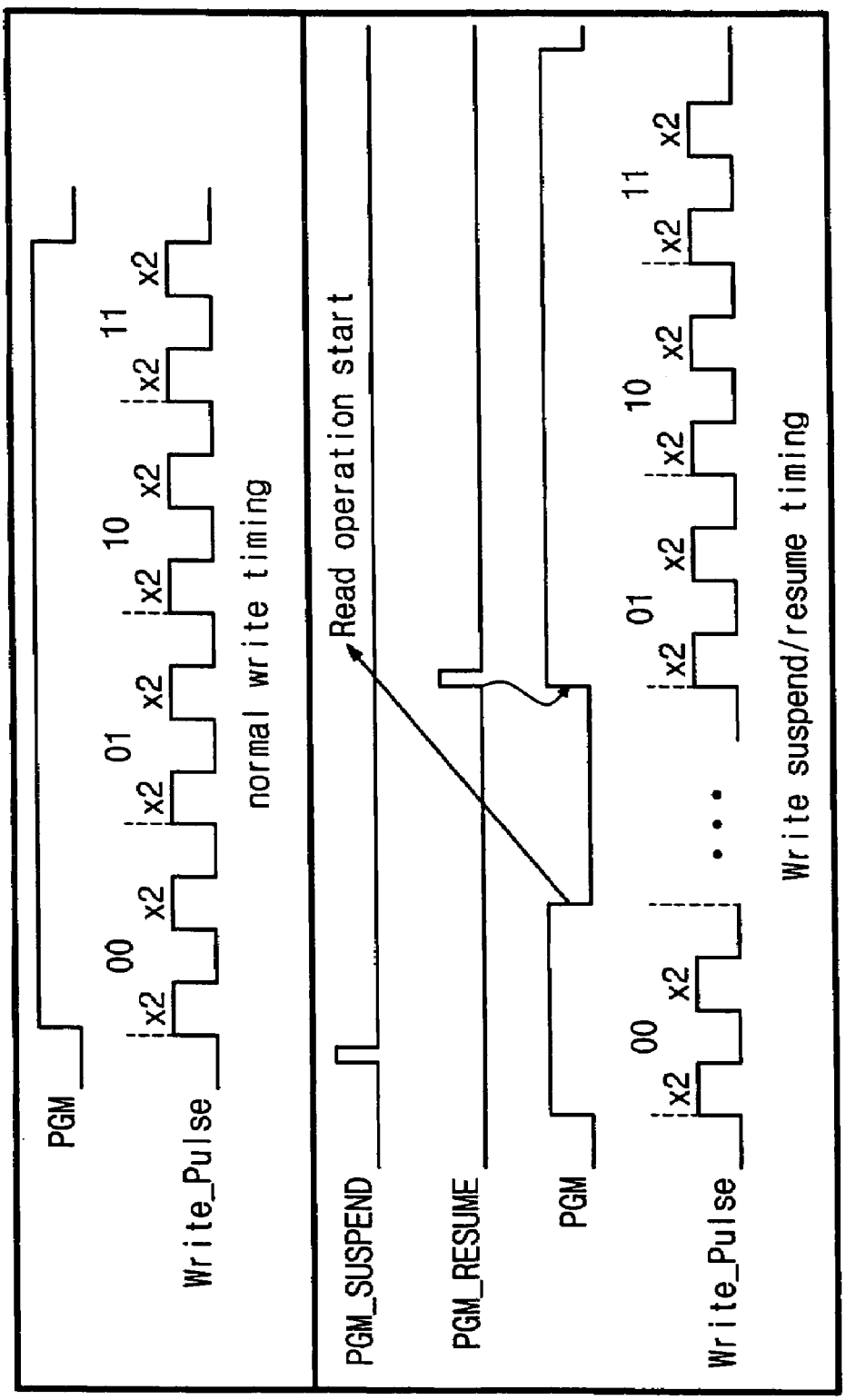
FIG. 9 is a waveform timing diagram illustrating a program-suspend-read operation for a phase-change memory cell according to an embodiment of the present invention.

FIG. 9 is a waveform timing diagram illustrating the operation of a PRAM device according to one embodiment of the present invention. In FIG. 9, a pair of waveforms labeled "normal write timing" illustrate an uninterrupted write operation of a write data block in the PRAM device. A remaining set of four waveforms, labeled "Write suspend/resume timing," illustrate a write-suspend-read operation of the write data block. In both the uninterrupted write operation and the write-suspend-read operation of FIG. 9, a square waveform labeled "Write_Pulse" represents the timing of a sequence of program pulses applied to the PRAM device to program the write data block.

The write data block is divided into first through fourth unit program blocks, wherein each unit program block comprises four (4) phase-change memory cells, or bits. The first through fourth unit program blocks are programmed in respective first through fourth unit program block write periods delimited by vertical lines in the waveforms labeled "Write_Pulse." The first through fourth unit program block write periods are respectively labeled with corresponding values "00, " "01," "10," and "11" of a counter signal.

Within each unit program block write period, there are two (2) square pulses. Each square pulse is illustrative of a time interval when one or more program pulses are generated to program selected phase-change memory cells of the write data block. The time interval represented by a square pulse will be referred to as a "program pulse interval" in this written description.

Memory cells that are programmed during the same program pulse interval are considered to be programmed "simultaneously" for purposes of this written description, even though the precise timing of their programming may vary, e.g., where one phase-change memory cell is programmed in response to a "set pulse" while the other memory cell is programmed in response to a "reset pulse." The memory cells programmed during the same program pulse interval are considered to be programmed simultaneously because there will be some overlap in the period in which respective set and/or reset pulses are applied to the programmed memory cells.

In FIG. 9, each square pulse is labeled "x2" to indicate that two (2) phase-change memory cells are programmed during each program pulse interval. Alternatively, there could be more or less than two (2) phase-change memory cells programmed during each program pulse interval.

Although FIG. 9 illustrates a write data block divided into four (4) unit program blocks of four (4) memory cells each, wherein two (2) phase-change memory cells are programmed during each program pulse interval, the number of unit program blocks per write data block, the number of program pulse intervals per unit program block write period, and the number of memory cells programmed during each program pulse interval can be changed by a system designer as desired.

To program the phase-change memory cells of the write data block described in relation to FIG. 9, the PRAM device first receives a plurality of data input signals corresponding to the phase-change memory cells. If the data input signal corresponding to a particular memory cell has a logic level '1,' the PRAM generates a reset pulse to place the memory cell in the reset state. Otherwise, if the data input signal corresponding to the memory cell has a logic level '0,' the PRAM generates a set pulse to place the memory cell in the set state.

In FIG. 9, a program signal PGM is used to represent periods in which the phase-change memory cells of the PRAM are programmed. Where program signal PGM is high, the memory cells are programmed, and where program signal PGM is low, the memory cells are not programmed.

In the uninterrupted write operation, the first through fourth unit program blocks are programmed in an uninterrupted sequence, as evidenced by program signal PGM, which is high throughout the first through fourth unit program block write periods. In contrast, in the write-suspend-read operation, the first unit program block is programmed, followed by a read operation, and then the second through fourth unit program blocks are programmed after the read operation finishes. In the uninterrupted write operation, the counter signal is incremented with each successive unit program block write period.

In the write-suspend-read operation, a suspend signal PGM_SUSPEND is briefly asserted while the first unit program block is being programmed. In response to suspend signal PGM_SUSPEND, programming of the write data block is suspended after the first unit program block is programmed. The read operation is then performed once programming of the write data block is suspended. Then, as soon as the read operation finishes, a resume signal PGM_RESUME is asserted, allowing programming of the second through fourth unit program blocks to proceed to completion. In the write-suspend-read operation, the counter signal is suspended during the read operation, and it resumes upon completion of the read operation.

Figure 10:
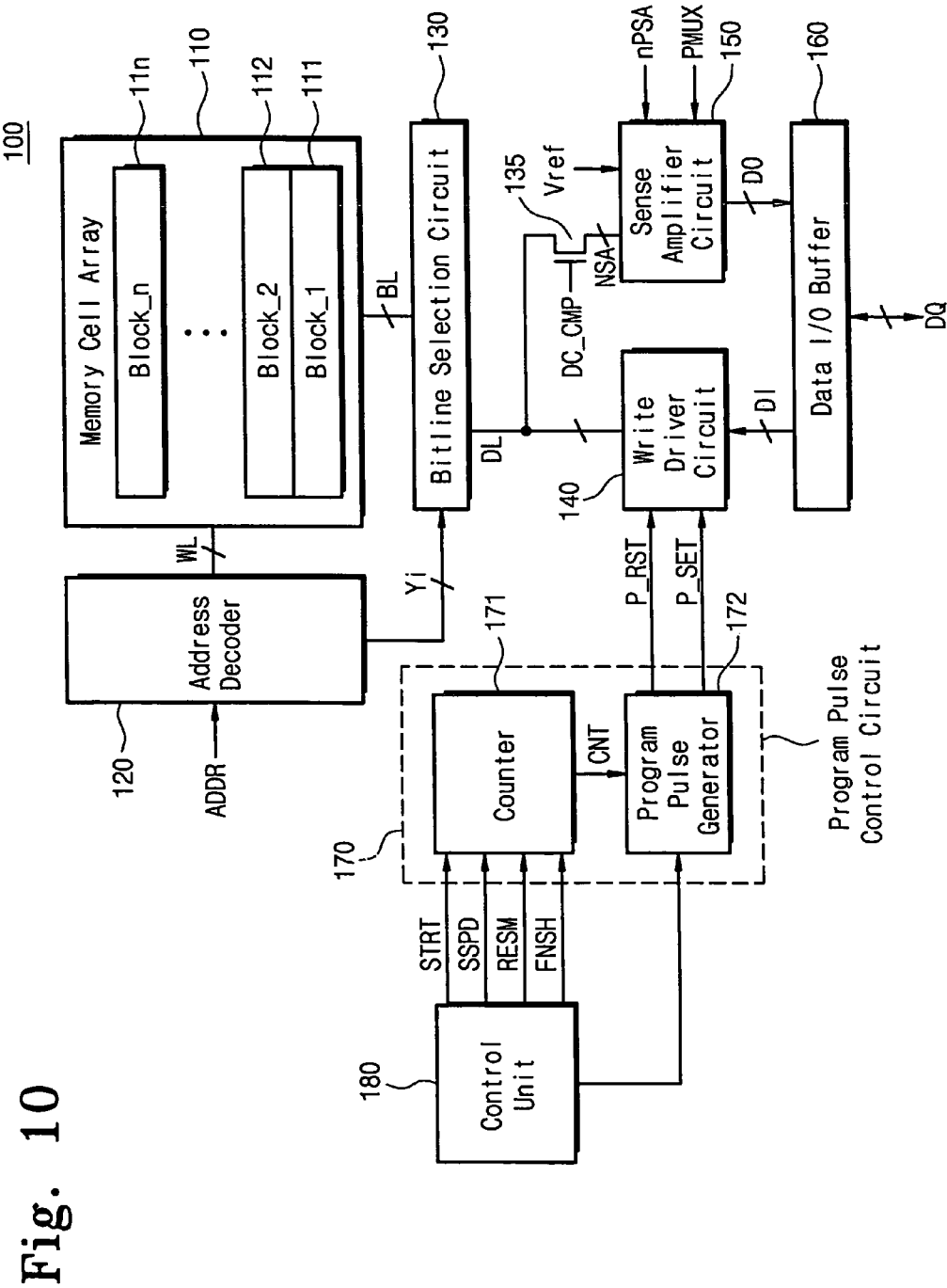
FIG. 10 is a block level diagram of a PRAM device according to an embodiment of the present invention.

FIG. 10 is a block level diagram of a PRAM device 100 adapted to perform a program-suspend-read operation according to one embodiment of the present invention. Referring to FIG. 10, PRAM device 100 comprises a memory cell array 110, which includes a plurality of memory blocks 111 through 11n. Each of memory blocks 111 through 11n comprises a plurality of phase-change memory cells. Memory cell array 110 is operatively connected to an address decoder 120 and a bitline selection circuit 130 within PRAM device 100.

PRAM device 100 further comprises a write driver circuit 140 and a sense amplifier circuit 150 operatively connected to bitline selection circuit 130, a data I/O buffer 160, a program pulse control circuit 170 comprising a counter 171 and a program pulse generator 172 and operatively connected to write driver circuit 140, and a control unit 180 operatively connected to program pulse control circuit 170.

To program a memory block (i.e., a write data block) in memory cell array 110, address decoder 120 decodes an address ADDR of the write data block to generate a wordline voltage and a plurality of bitline selection signals $Y_i$. The write data block is selected by applying the wordline voltage to the write data block through a wordline bus WL, applying bitline selection signals $Y_i$ to bitline selection circuit 130 to select bitlines BL connected to the write data block.

A plurality of input data signals DI representing data to be written to the write data block are applied to write driver circuit 140 from data I/O buffer 160. The values of the input data signals DI are determined by data received in data I/O buffer 160 through an I0 bus DQ.

Program pulse generator 172 applies program pulses to write driver circuit 140 in response to counter 171, and write driver circuit 140 generates write currents to program selected memory cells in memory cell array 110 based on the program pulses and the values of input data signals DI. An exemplary operation and configuration of write driver circuit 140 is described below in relation to FIG. 13. In addition, other examples of a write driver circuit compatible with the PRAM device are disclosed in related and commonly assigned U.S. patent application Ser. No. 10/829,807.

The write currents generated by write driver circuit 140 are provided to bitline selection circuit 130 via a data line DL, and the write currents are respectively applied to selected bitlines BL through bitline selection circuit 130. Write driver 140 preferably generates the write currents according to a timing sequence such as that illustrated in FIG. 9. In other words, the bitlines are preferably driven in such a way unit program blocks in the write data block are programmed in a sequence.

The timing and sequence in which the memory cells of the write data block are programmed is controlled by program pulse control circuit 170, which in turn is controlled by control unit 180. At the beginning of a program operation of a write data block, control unit 180 applies a start signal START to counter 171 to initialize a counter signal CNT output by counter 171. For explanation purposes, it will be assumed that the write data block comprises four unit program blocks as described above in relation to FIG. 9. Accordingly, counter signal CNT is represented by two bits and is initialized to "00."

Program pulse generator 172 receives counter signal CNT and sends program pulses to write driver circuit 140 based on the value of counter signal CNT. For instance, where counter signal CNT has the value "00," program pulse generator 172 generates program pulses for programming a first unit program block; where the value of counter signal CNT is "01," program pulse generator 172 generates program pulses for programming a second unit program block, and so on.

To suspend the program operation in order to perform a read operation, control unit 180 generates a suspend signal SSPD to suspend counter 171. As a result, program pulse generator 172 stops generating program pulses while the read operation is executed. Once the read operation is completed, control unit 180 generates a resume signal RESM to cause counter signal CNT to continue counting, and consequently to cause program pulse generator 172 to continue generating program pulses.

Finally, once the program operation finishes, control unit 180 generates a finish signal FNSH, which causes counter 171 to stop counting and program pulse generator 172 to stop generating program pulses.

To read a memory block (i.e., a read data block) in memory cell array 110, address decoder 120 decodes an address ADDR of the read data block to generate a wordline voltage and bitline selection signals $Y_i$ for selecting the memory cells of the read data block. Then, data values stored in the selected memory cells are transferred to sense amplifier circuit 150 via data line DL. The data values pass from data line DL through a clamping transistor 135, and then to a sensing node NSA connected to sense amplifier 150. Clamping transistor 135 is connected between data line DL and sensing node NSA, is gated by a control signal DC CMP, and functions to clamp the bit line voltage at or below a threshold voltage suitable for reading the phase-change memory cells in memory cell array 110.

Sense amplifier 150 reads the data values by comparing the voltage of sense node NSA with a reference voltage Vref under the control of control signals nPSA and PMUX. Sense amplifier 150 then outputs the result of the comparison as an output signal D0. An exemplary configuration and operation of sense amplifier 150 is described below in relation to FIGS. 14 and 15. Still other examples of sense amplifiers are described, for example, in related and commonly assigned U.S. patent application Ser. No. 11/316,017, the disclosure of which is hereby incorporated by reference.

Output signal D0 of sense amplifier 150 is applied to data I/O buffer 160, which outputs corresponding output data on I/O bus DQ. The operation and internal circuit configuration of data I/O buffer 160 are well understood by those of ordinary skill, and therefore a detailed description of output buffer 160 is omitted here.

Figure 11A:
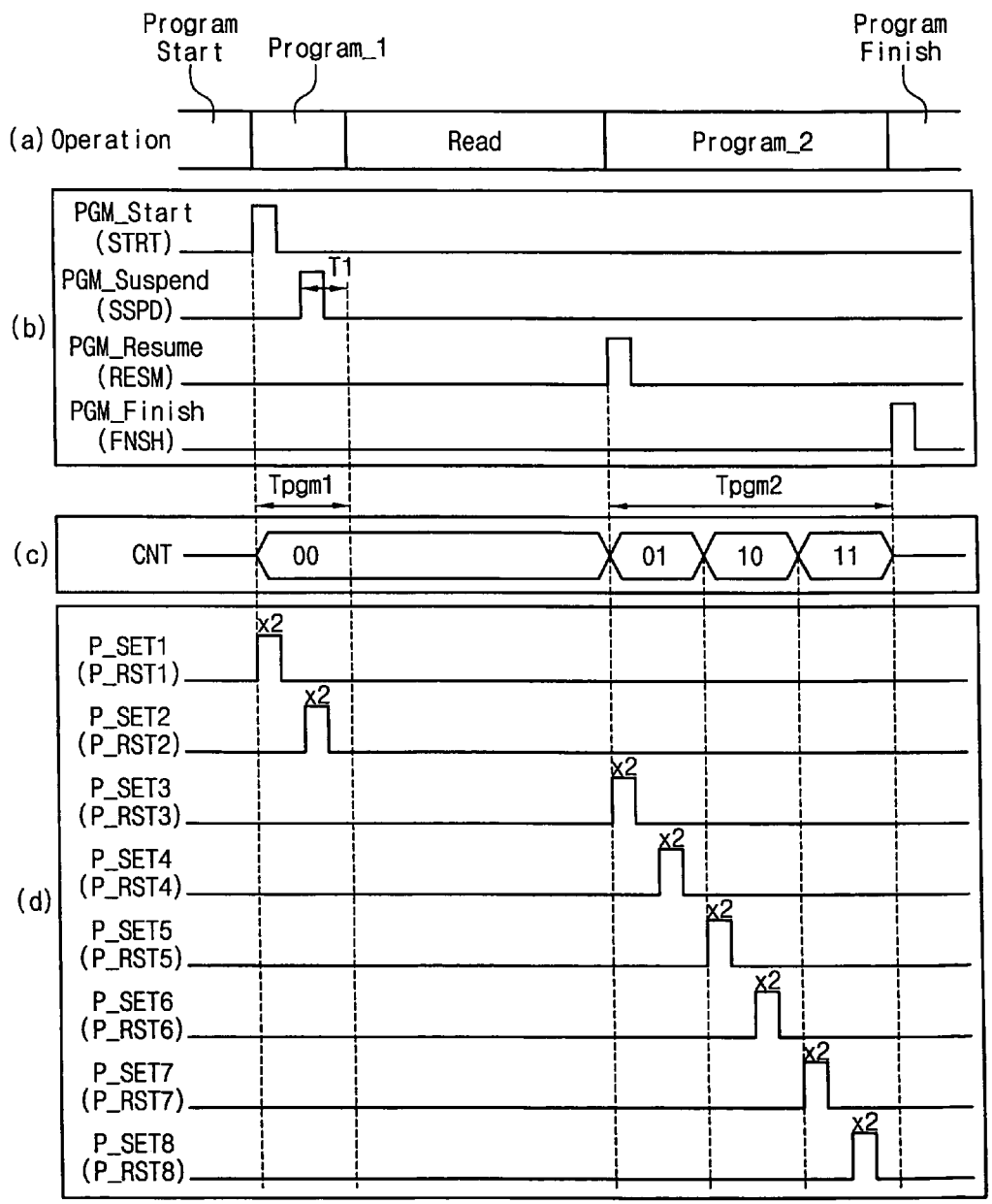
FIGS. 11A and 11B are waveform timing diagrams illustrating a program-suspend-read operation of the PRAM device shown in FIG. 10.
Figure 11B:
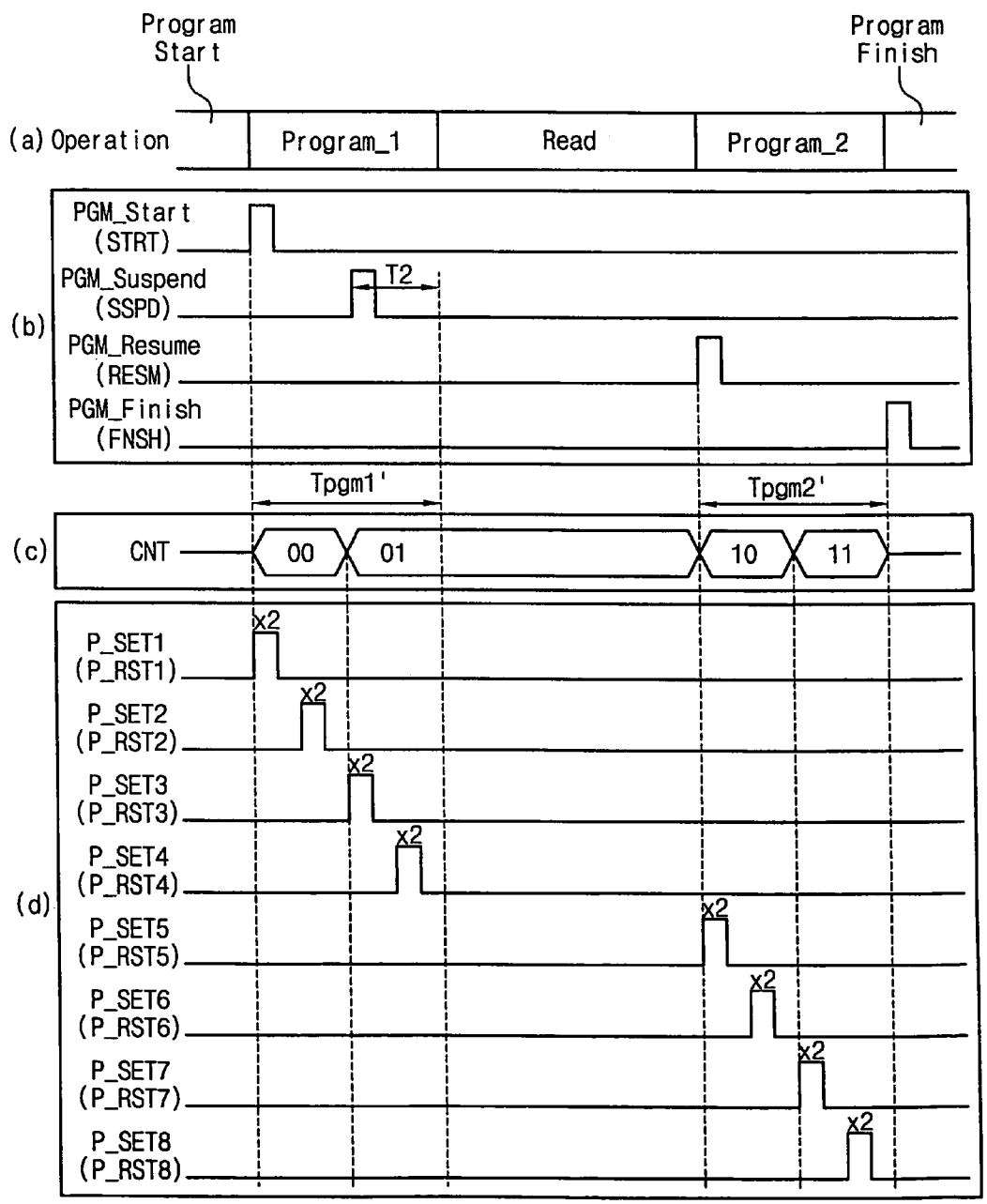

FIGS. 11A and 11B are waveform timing diagrams illustrating program-suspend-read operations of PRAM device 100 shown in FIG. 10. In particular, FIG. 11A shows a program-suspend-read operation wherein a program operation is suspended after a first unit program block is executed. While the program operation is suspended, a read operation is executed. Then, the program operation resumes and second, third, and fourth program operations are executed. FIG. 11B shows a program-suspend-read operation wherein a program operation is suspended after first and second unit program blocks are executed. While the program operation is suspended, a read operation is executed. Then, the program operation resumes and third and fourth program operations are executed.

In FIGS. 11A and 11B, diagrams labeled "(a)" identify the operations performed by PRAM device 100 during particular time intervals; waveforms labeled "(b)" illustrate control signals output by control unit 180; waveforms labeled "(c)" illustrate counter signals output by counter 171; and, waveforms labeled "(d)" illustrate pulse signals generated by program pulse generator 172 during a first unit program block write period (Tpgm1,Tpgm1') and a second unit program block write period (Tpgm2, Tpgm2').

Referring to FIG. 11A, start signal STRT is briefly asserted to initiate a program operation. Upon initiation of the program operation, counter signal CNT is initialized to "00," and a first pair of program pulses are asserted during a first program pulse interval of a first unit program block write period. The fact that a pair of program pulses are asserted during each program pulse interval is denoted by the labels "x2" in FIGS. 11A and 11B. In another preferred embodiment of the invention, four program pulses are asserted to program four phase-change memory cells during each program pulse interval. Such a configuration could be indicated, for example, by labeling each program pulse interval with labels "x4."

Each unit program block write period in FIGS. 11A and 11B includes two (2) program pulse intervals and is delimited by vertical dashed lines. Set and reset pulses in FIGS. 11A and 11B are labeled P_SETn, and P_RSTn, respectively, where "n" ranges from 1 to 8.

A second pair of program pulses are briefly asserted during the first unit program block write period, Tpgm1, after the first program pulse pair is asserted; however, before the second pair of program pulses finishes being asserted, program suspend signal SSPD is asserted. Suspend signal SSPD causes the program operation to be suspended as soon as the first unit program block write period finishes so that a read operation can be executed.

While the program operation is suspended, the value of counter signal CNT remains the same. Once the read operation finishes, resume signal RESM is asserted to resume the program operation. Upon resuming the program operation, the value of counter signal CNT increments, and third and fourth program pulse pairs are asserted during the second unit program block.

Next, in a third unit program block write period, fifth and sixth program pulse pairs are asserted and counter signal CNT is again incremented. Then, in a fourth unit program block write period, seventh and eighth program pulse pairs are asserted and counter signal CNT is yet again incremented. Finally, after the fourth unit program block write period, a program finish signal PGM_FINISH is asserted to finish the program operation.

FIG. 11B is similar to FIG. 11A, except that program suspend signal PGM_Suspend is asserted during second unit program block write period, Tpgm2', and the read operation is executed between the second and third unit program block write periods. Accordingly, the first and second unit program block write periods follow immediately after each other, and the third and fourth unit program block write periods also follow immediately after each other.

Figure 12:
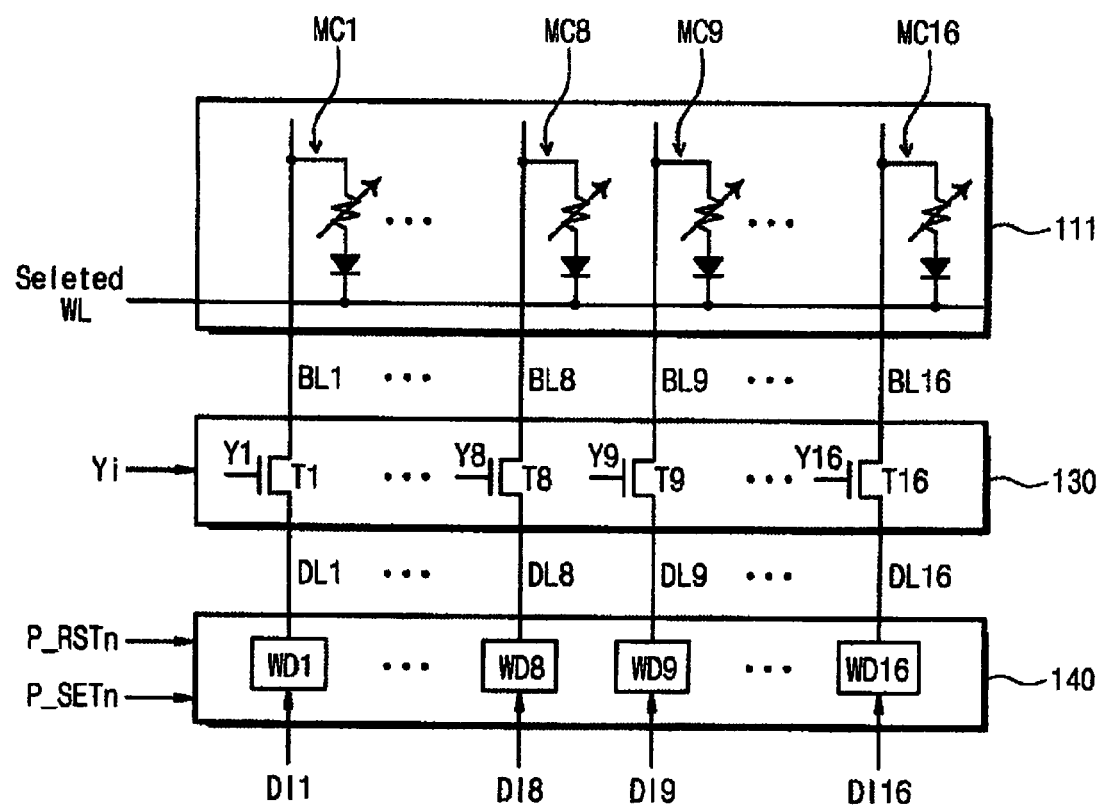
FIG. 12 is a circuit diagram of a memory block, a bitline selection circuit, and a write driver circuit included in the PRAM device of FIG. 10.

FIG. 12 is a circuit diagram showing an exemplary embodiment of memory block 111, bitline selection circuit 130, and write driver circuit 140 included in PRAM device 100 of FIG. 10.

Referring to FIG. 12, memory block 111 comprises a plurality of diode-type phase-change memory cells MC1 through MC16 connected to a wordline WL and respectively connected to a plurality of bitlines BL1 through BL16.

Bitline selection circuit 130 comprises a plurality of bitline selection transistors T1 through T16 respectively connected between bitlines BL1 through BL16 and a plurality of data lines DL1 through DL16. Bitline selection transistors T1 through T16 are respectively gated by bitline selection signals $Y_i$ through Y16 to supply respective write currents from write driver 140 to memory block 111.

Write driver circuit 140 comprises a plurality of write drivers WD1 through WD16 respectively connected to data lines DL1 through DL16 and adapted to supply respective write currents to data lines DL1 through DL16 in response to respective data input signals DI1 through DI16.

Figure 13:
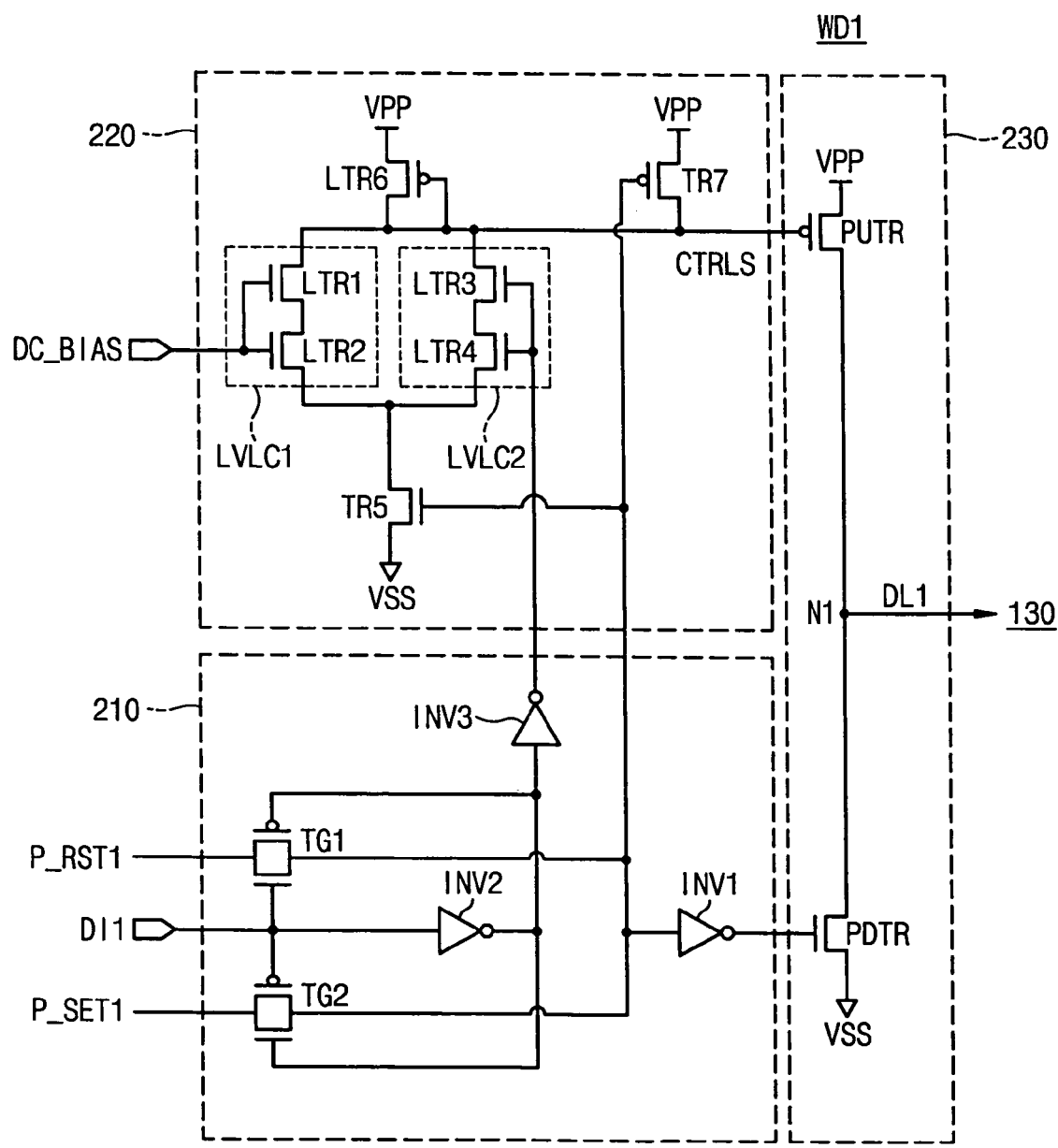
FIG. 13 is a circuit diagram of a write driver included in the PRAM device of FIG. 10.

FIG. 13 is a circuit diagram of an exemplary embodiment of a write driver WD1 shown in FIG. 12. Referring to FIG. 13, write driver WD1 comprises a pulse selection circuit 210, a current control circuit 220, and a current drive circuit 230.

Pulse selection circuit 210 outputs either a reset pulse P_RST1 or a set pulse P_SET1 in response to a logic level of data input signal DI1. Pulse selection circuit 210 functions to selectively apply reset pulse P_RST1 or set pulse P_SET1 to current control circuit 220 to write a logical '0' or a logical '1' to a corresponding selected phase-change memory cell.

Current control circuit 220 receives a bias voltage DC_BIAS, and outputs a control signal CTRLS during a program pulse interval when reset pulse P_RST1 or set pulse P_SET1 is asserted. Where data input signal DI1 has logic level '1,' control signal CTRLS is output with a first voltage level while reset pulse P_RST is asserted. Where data input signal DI1 has logic level '0,' control signal CTRLS is output with a second voltage level while reset pulse P_RST is asserted.

Current control circuit 220 functions to control the level of a current supplied to current drive circuit 230 during the program pulse interval when reset pulse P_RST1 or set pulse P_SET1 is asserted. When reset pulse P_RST1 is asserted, the level of the current supplied to current drive circuit 230 is larger than when set pulse P_SET1 is asserted.

Current drive circuit 230 outputs a write current for programming the corresponding phase-change memory cell through a data line DL1. The write current is output in response to control signal CTRLS.

Pulse selection circuit 210 comprises first and second transmission gates TG1 and TG2, and first through third inverters INV1, INV2, and INV3. First transmission gate TG1 outputs reset pulse P_RST1 when data input signal DI1 has logic level '1,' and second transmission gate TG2 outputs set pulse P_SET1 when data input signal DI1 has logic level '0.'

Data input signal DI1 passes through second and third inverters INV2 and INV3 before being output from pulse selection circuit 210 to current control circuit 220. The second and third inverters INV2 and INV3 collectively act as a buffer for data input signal DI1. First inverter INV1 inverts the output of the first or second transmission gate TG1 or TG2 and outputs the inverted output to the current drive circuit 230.

Current control circuit 220 comprises a first level transistor LTR6, a first level controller LVLC1, a second level controller LVLC2, a first control transistor TR5, and a second control transistor TR7.

First level transistor LTR6 comprises a positive metal-oxide semiconductor (PMOS) transistor with a source connected to a power source voltage VDD, and a gate and a drain connected to each other. First level controller LVLC1 is turned on in response to bias voltage DC_BIAS and controls the level of control signal CTRLS.

First level controller LVLC1 comprises a first level transistor LTR6 and a second level transistor LTR2 that are connected in series between a drain of first level transistor LTR6 and a drain of first control transistor TR5. Bias voltage DC_BIAS is applied to gates of first level transistor LTR6 and second level transistor LTR2.

Second level controller LVLC2 controls control signal CTRLS to be generated at a first voltage level or a second voltage level based on the logic level of data input signal DI1 output from pulse selection circuit 210. Second level controller LVLC2 includes a third level transistor LTR3 and a fourth level transistor LTR4 that are connected in series between the drain of first level transistor LTR6 and the drain of first control transistor TR5. Input data signal DI1 is applied to gates of third level transistor LTR3 and fourth level transistor LTR4. First through fourth level transistors LTR6, LTR2, LTR3, and LTR4 each comprise an NMOS transistor.

First control transistor TR5 controls the operation of current control circuit 220 in response to reset pulse P_RST1 or set pulse P_SET. First control transistor TR5 has a drain commonly connected to sources of second level transistor LTR2 and fourth level transistor LTR4, a source connected to ground VSS, and a gate to which reset pulse P_RST1 or set pulse P_SET1 is applied. First control transistor TR5 each comprise an NMOS transistor.

Second control transistor TR7 turns off first level transistor LTR6 whenever neither of reset pulse P_RST1 or set pulse P_SET1 is asserted, and outputs control signal CTRLS with a third voltage level. Second control transistor TR7 has a source connected to power source voltage VDD, a drain connected to the drain of first level transistor LTR6, and a gate to which reset pulse P_RST1 or set pulse P_SET1 is applied. Second control transistor TR7 comprises a PMOS transistor.

Current drive circuit 230 includes a pull up transistor PUTR and a pull down transistor PDTR. Pull up transistor PUTR has a source connected to power source voltage VDD, a drain connected to a first node N1, and a gate to which control signal CTRLS is applied.

Pull down transistor PDTR has a drain connected to first node N1, a source connected to ground VSS, and a gate to which inverted reset pulse P_RST1 or set pulse P_SET1 is applied.

Pull down transistor PDTR is turned off and the pull up transistor PUTR is turned on during the program pulse interval when reset pulse P_RST1 or set pulse P_SET is asserted. The degree to which pull up transistor PUTR is turned on is controlled according to the voltage level of control signal CTRLS, and accordingly, the amount of write current applied to the phase-change memory array through data line DL depends on the voltage level of control signal CTRLS.

Pull up transistor PUTR is turned off and pull down transistor PDTR is turned on whenever neither of reset pulse P_RST1 or set pulse P_SET is asserted. As a result, first node N1 is connected to ground VSS and discharged.

First level controller LVLC1 is turned on in response to bias voltage DC_BIAS. When input data signal DI1 has logic level '0', set pulse P_SET1 is applied to first control transistor TR5 and second control transistor TR7 of current control circuit 220. While set pulse P_SET is asserted, first control transistor TR5 is turned on, second control transistor TR7 is turned off, and first level transistor LTR6 is turned on.

Third and fourth level transistors LTR3 and LTR4 are turned off when input data signal DI1 has logic level '0.' When first control transistor TR5, first level transistor LTR3, and second level transistor LTR4 are turned on, control signal CTRLS is generated with the first voltage level (e.g., a "low" voltage level) to turn on pull up transistor PUTR.

Where set pulse P_SET is asserted, pull up transistor PUTR is turned on and pull down transistor PDTR is turned off. Where set pulse P_SET1 is not asserted second control transistor TR7 is turned on and control signal CTRLS is generated with the second voltage level, e.g., a "high" voltage level. As a result, pull up transistor PUTR is turned off and pull down transistor PDTR is turned on, thereby discharging the first node N1 to ground VSS. Where input data signal DI1 has logic level '1,' reset pulse P_RST1 is asserted and applied to first control transistor TR5 and second control transistor TR7 of current control circuit 220. While reset pulse P_RST1 is asserted, first control transistor TR5 is turned on, second control transistor TR7 is turned off, and first level transistor LTR6 is turned on.

Third and fourth level transistors LTR3 and LTR4 of second level controller LVLC2 are turned on when input data signal DI1 has logic level '1.' Where first control transistor CRT1, and first through fourth level transistors LTR6, LTR2, LTR3, and LTR4 are all turned on, control signal CTRLS is generated with the second voltage level to turn on pull up transistor PUTR. The second voltage level is even lower than the first voltage level generated when set signal P_SET1 is asserted.

Accordingly, where input data signal DI1 has logic level '1,' control signal CTRLS assumes the second voltage level. As a consequence, the level of control signal CTRLS decreases further and pull up transistor PUTR is turned on more than when only first and second level transistors LTR6 and LTR2 are turned on. As a result, the level of the write current is higher when reset pulse P_RST1 is asserted than when set pulse P_SET1 is asserted.

Thus, where input data signal DI1 has logic level '1,' reset pulse P_RST1 is applied to current control circuit 220 and the level of the write current through data line DL1 is higher than when set pulse P_SET1 is applied to current control circuit 220 when input data signal DI1 has logic level '0.'

Where neither set pulse P_SET1 nor reset pulse P_RST1 is asserted, second control transistor TR7 is turned on and control signal CTRLS is generated with the third voltage level, which is a "high" level that turns off pull up transistor PUTR. As a result, first node N1 is discharged to ground VSS through pull down transistor PDTR.

Figure 14:
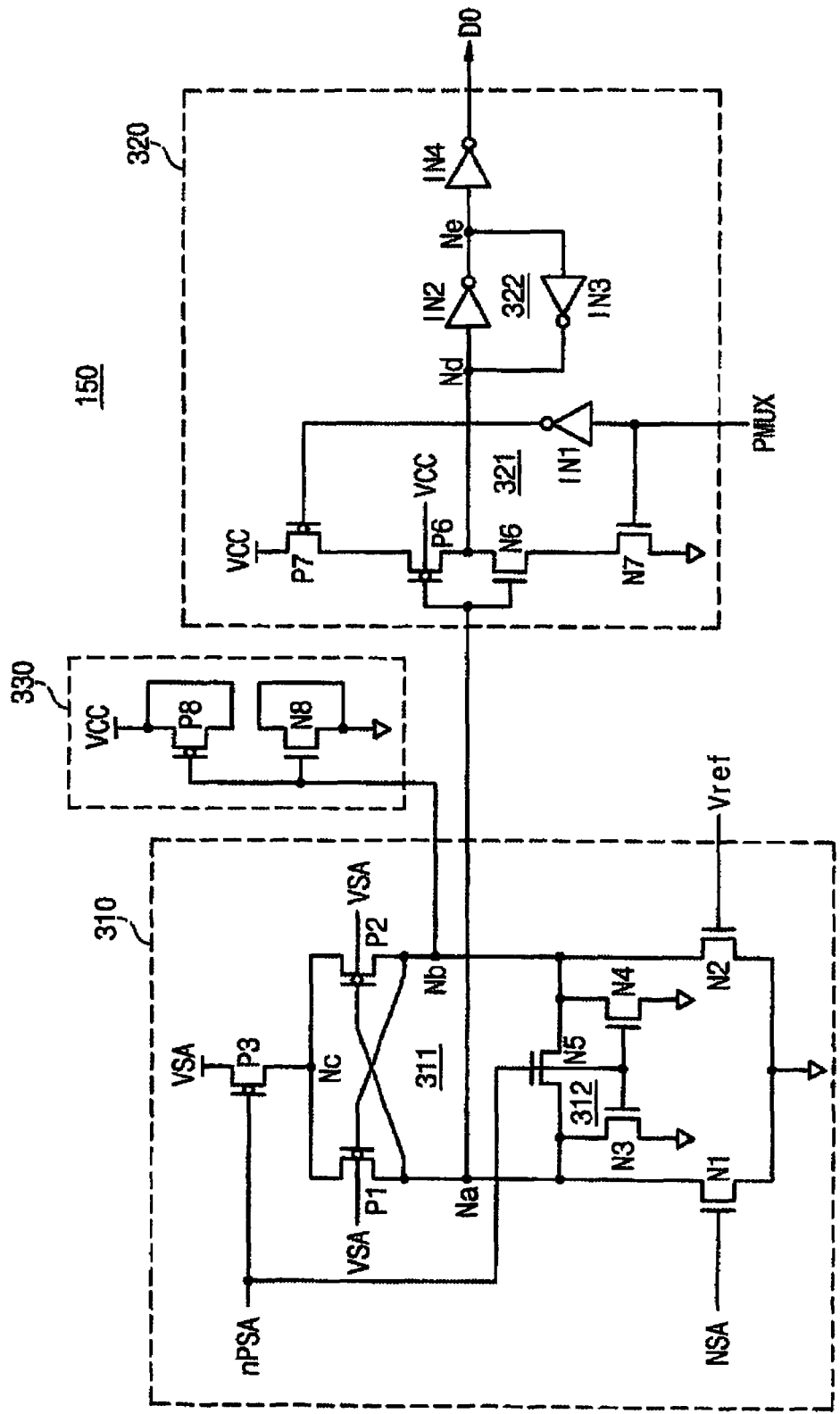
FIG. 14 is a circuit diagram of a sense amplifier circuit included in the PRAM device of FIG. 10.

FIG. 14 is a circuit diagram of sense amplifier 150 shown in FIG. 10. Sense amplifier 150 of FIG. 14 includes a sensing portion 310, a latch portion 320, and a dummy latch portion 330. Preferably, at least sensing portion 310 of sense amplifier 150 is driven by a boosted voltage VSA, which is greater than an internal power supply voltage VCC.

Figure 5:
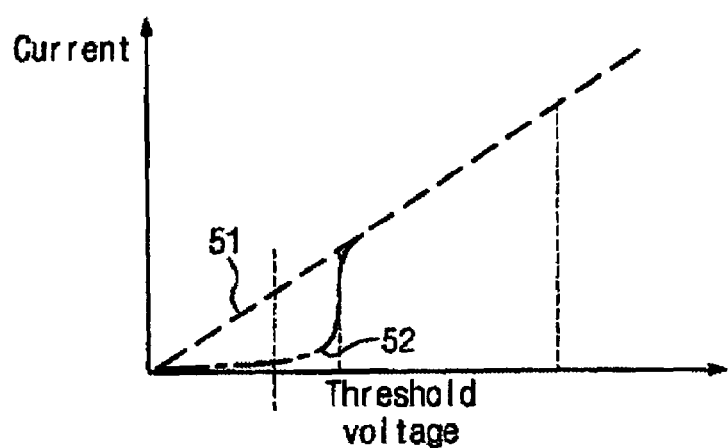
FIG. 5 is a graph showing resistive characteristics of a phase-change memory cell.
Figure 6:
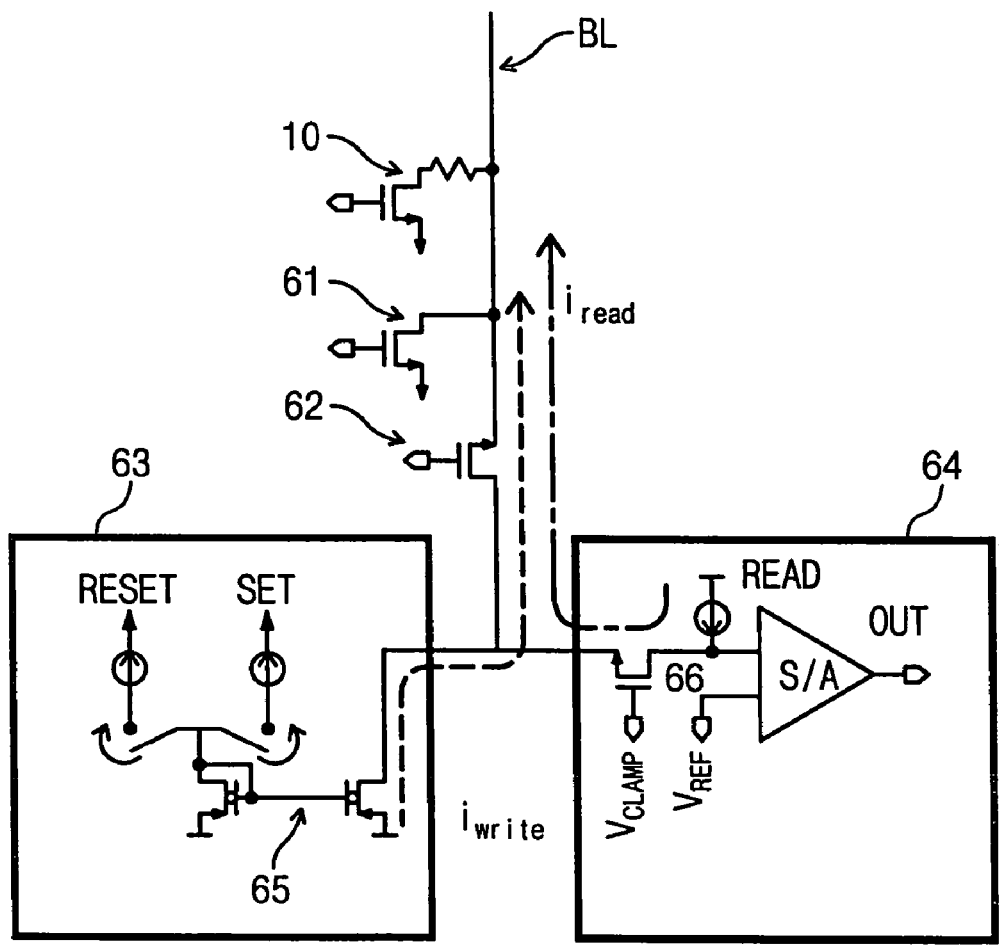
FIG. 6 is a circuit diagram of write and read circuits of a phase-change memory cell.
Figure 7:
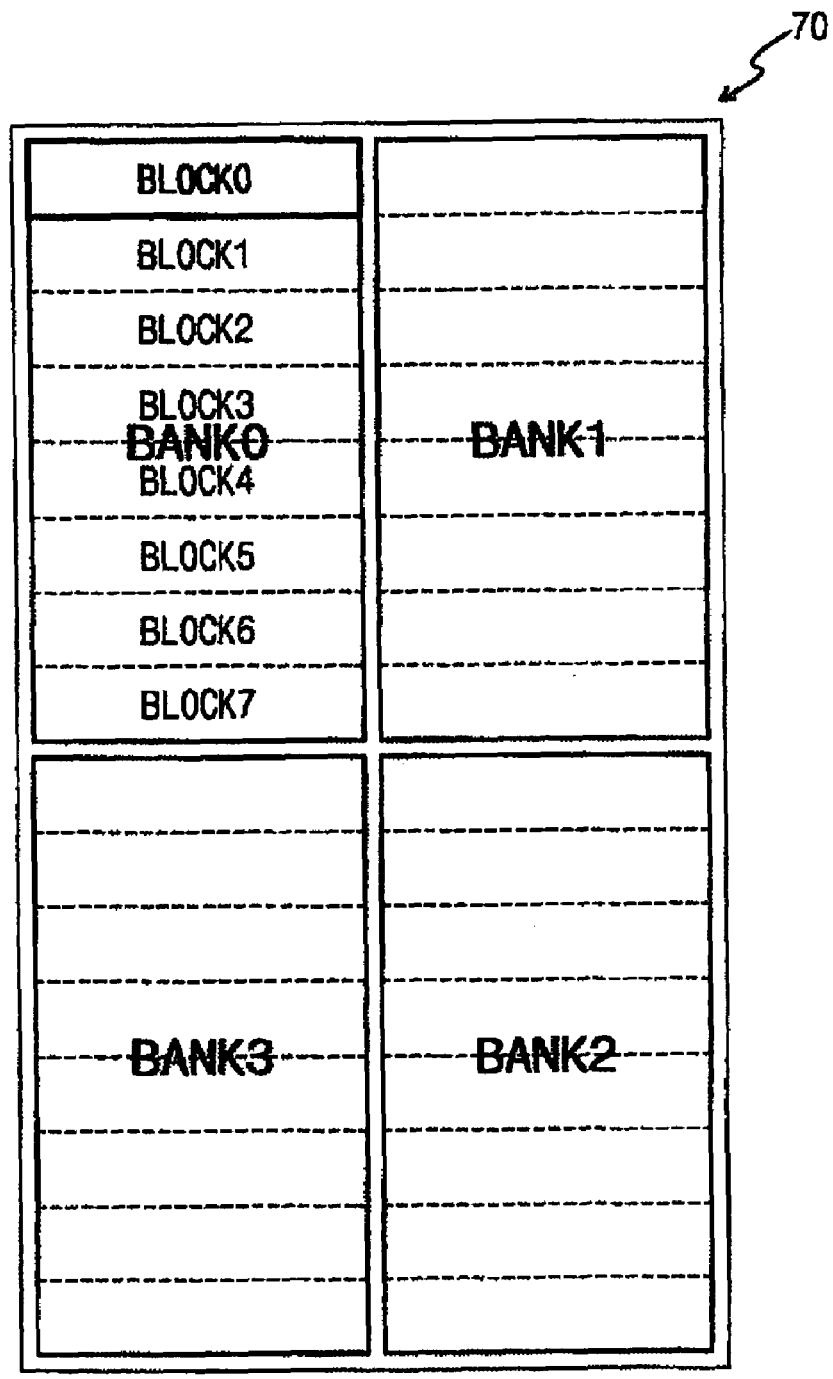
FIG. 7 is a schematic diagram of a memory cell array in a RWW memory device.
Figure 8:
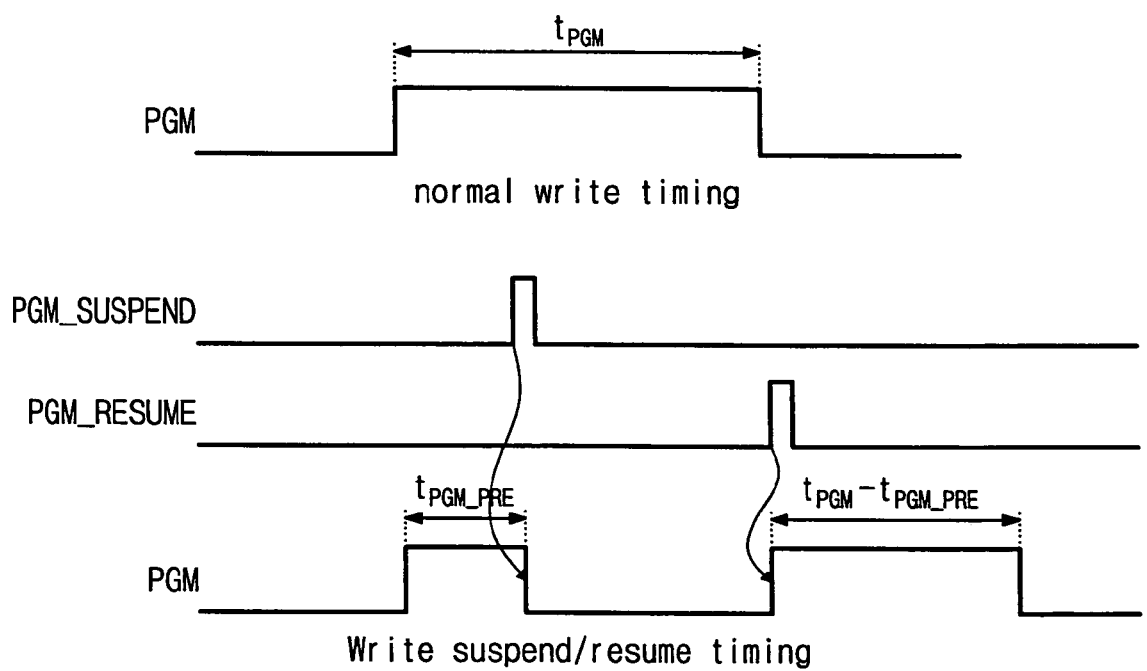
FIG. 8 is a waveform timing diagram illustrating a program-suspend-read operation for a flash memory cell.

Sensing portion 310 includes a sensing circuit 311 and an equalizer circuit 312. Sensing portion 310 of this example includes p-type transistors P1 through P3 and n-type transistor N1 through N5 all connected as shown in FIG. 5 between the boosted voltage VSA and ground. Sensing node NSA is connected to the gate of transistor N1, and a read threshold voltage Vref is connected to the gate of transistor N2. Equalizer circuit 312 is connected across sensing circuit nodes Na and Nb as shown; and control signal nPSA is applied to the gates of transistors P3, N3, N4 and N5.

Latch portion 320 of this example includes an inverter circuit 321 and a latch circuit 322. As shown in FIG. 14, inverter circuit 321 is connected to sensing circuit node Na of sensing portion 310, and includes p-type transistors P6 and P7, n-type transistors N6 and N7, and inverter IN1. Latch circuit 322 includes inverters IN2 through IN4. In this example, latch portion 320 is driven by internal power supply voltage VCC. Also, in inverter circuit 321, control signal PMUX is applied to the input of inverter IN1 and to the gate of transistor N7.

Dummy latch portion 330 of this example is driven by VCC and includes an n-type transistor N8 and a p-type transistor P8, each having gates connected to the sensing circuit node Nb. As will be appreciated by those skilled in the art, dummy latch portion 330 is provided to match the load of latch portion 320 across sensing portion 310.

Figure 15:
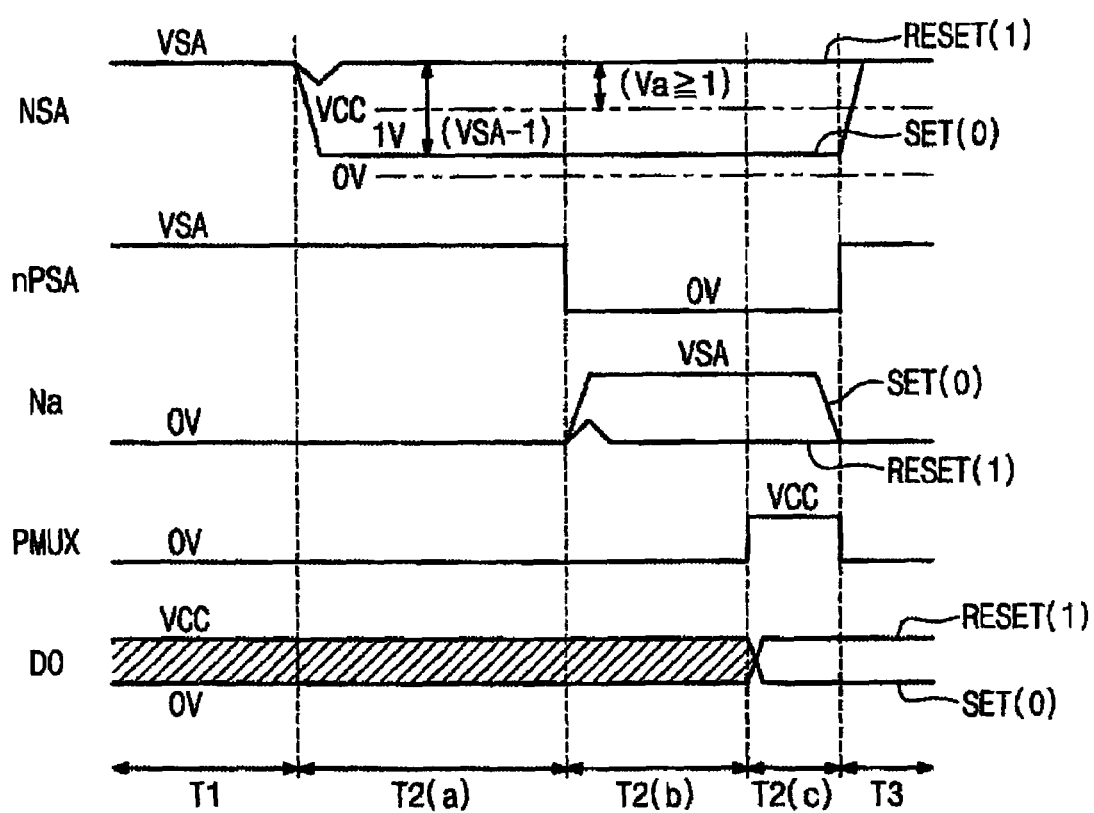
FIG. 15 is a waveform timing diagram for use in explaining the operation of the sense amplifier of FIG. 14; and, FIG. 16 is a block diagram of a system including a PRAM device according to embodiments of the present invention.

The operation of sensing amplifier 150 shown in FIG. 14 is described below in relation to FIG. 15. Referring collectively to FIGS. 14 and 15, during time interval T1, the voltage of control signal nPSA is boosted voltage VSA. Accordingly, sensing circuit 311 is disabled, and equalizing circuit 312 is enabled to bring sensing circuit nodes Na and Nb to ground (0 v). Further, control signal PMUX is low (0 v), thus disabling inverter circuit 321. The output D0 of sense amplifier 150 thus remains unchanged.

Next, in a time interval T2(a), the voltage of sense node NSA either remains at VSA or drops to about 1V, (VSA-1), depending on whether a read memory cell is in its 'reset', RESET(1), or 'set' state, (SET(0)).

Next, in a time interval T2(b), the voltage of control signal nPSA goes to 0v, thus enabling sensing circuit 311 and disabling equalizing circuit 312. Sensing circuit node Na goes to VSA in the case of the 'set' state where sense node NSA voltage (about 1v) is less than reference voltage Vref, and sensing circuit node Na goes to 0v in the case of the 'reset' state where the NSA voltage (VSA) is greater than reference voltage Vref (Va≧1).

Then, in an interval T2(c), control signal PMUX is brought to VCC to enable inverter circuit 321. Inverter circuit 321 inverts either voltage VSA (high) or 0v (low) of internal sensing circuit node Na, and drives latch circuit 322 accordingly to either flip or maintain the output data D0.

Finally, in a time interval T3, the voltage of nPSA is returned to boosted voltage VSA to disable sensing circuit 311 and enable equalizing circuit 312, and control signal PMUX is return to low (0v), thus disabling inverter circuit 321.

Figure 16:
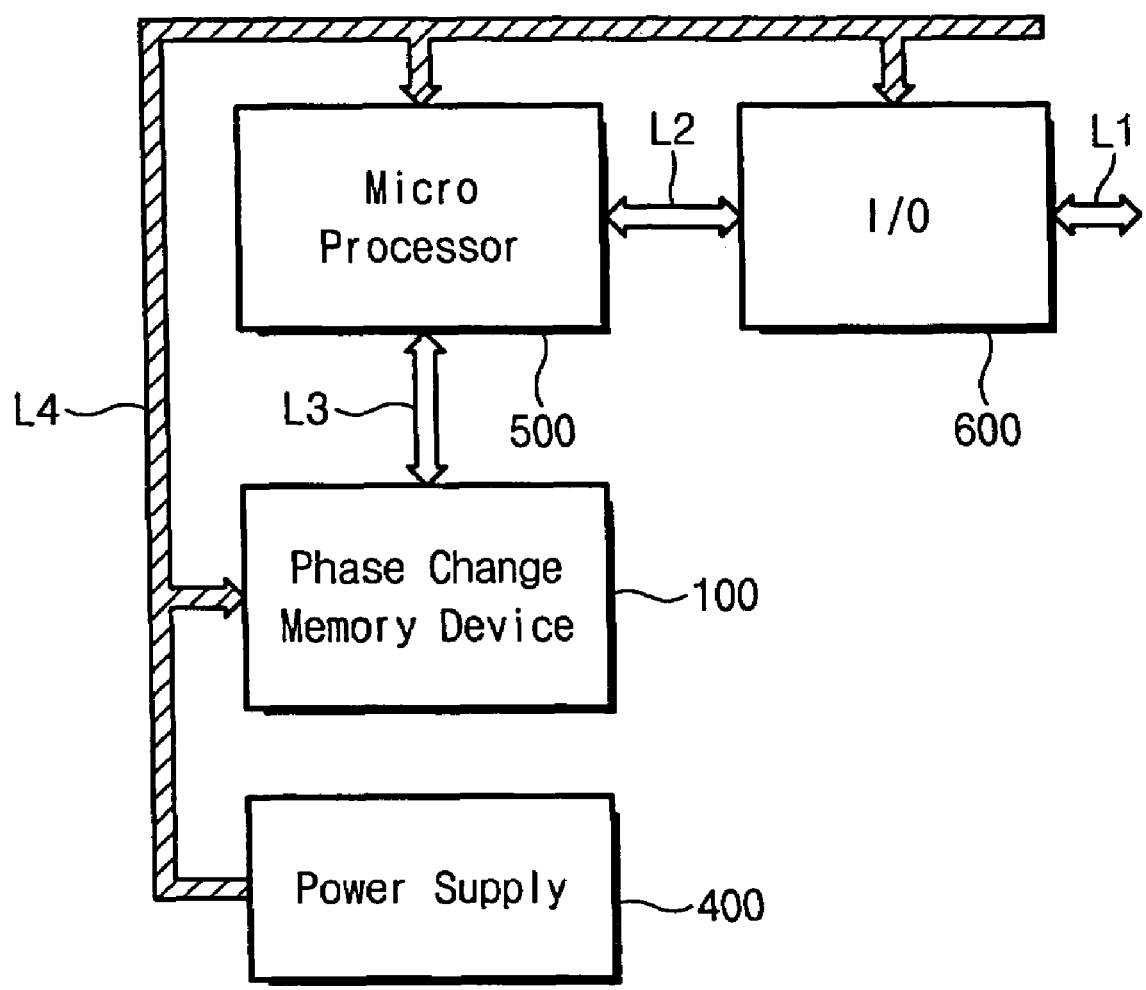

The PRAM device of the present invention may be utilized, for example, as the non-volatile memory of multiple types of microprocessor driven appliances. FIG. 16 is a simplified block diagram of a system containing PRAM device 100 described above. PRAM device 100 can function as random access memory of the system, or as a mass storage device of the system, or both. As illustrated, PRAM device 100 is connected to a microprocessor 500 via one or more data buses L3. Microprocessor 500 exchanges data over one or more data buses L2 with an I/O interface 600, and the I/O interface 600 transmits and receives data over input/output data lines L1. As examples, the input/output data lines L1 may be operatively coupled to a computer peripheral bus, a high speed digital communication transmission line, or an antenna system. A power distribution system L4 supplies power from a power supply 400 to PRAM device 100, microprocessor 500 and I/O interface 600.

The system of FIG. 16 may be utilized in both portable and non-portable appliances. In the case of portable appliances, power supply 400 will typical contain one or more battery cells. Phase-change memory devices, such as PRAM devices, are particularly suited to battery-powered applications in view of their non-volatile memory characteristics. Non-limiting examples of portable appliances include notebook computers, digital cameras, a personal digital assistants (PDA's), and mobile communication devices, such as mobile telephones, mobile email devices, and mobile gaming devices. Non-limiting examples of non-portable appliances include desk-top computers, network servers, and other computing devices typically driven by fixed commercial or residential power systems (such as AC power systems).

The foregoing preferred embodiments are teaching examples. Those of ordinary skill in the art will understand that various changes in form and details may be made to the exemplary embodiments without departing from the scope of the present invention as defined by the claims that follow.

What is claimed:

1. A phase-change random access memory (PRAM) operating method, comprising:
    programming a write data block comprising N unit program blocks in response to a program operation request;
    suspending the program operation after programming M unit program blocks, where M is less than N, in response to a read operation request;
    executing the read operation; and,
    resuming the programming of the write data block and programming (N–M) remaining unit program blocks.

2. The method of claim 1, wherein each one of the N unit program blocks comprises Q memory cells, and is programmed during an associated unit program block write period; and,
    wherein the suspending of the program operation comprises programming all Q memory cells in the Mth unit program block after receiving the read operation request during an Mth unit program block write period.

3. The method of claim 2, wherein Q is equal to 2 or 4.

4. The method of claim 2, wherein the PRAM comprises a control unit, and the method further comprises by operation of the control unit:
generating a start signal in response to the program operation request;
generating a suspend signal in response to the read operation request;
generating a resume signal upon completing the read operation; and,
generating a finish signal upon programming all N unit program blocks.

5. The method of claim 1, wherein the PRAM comprises a counter, and the method further comprises:
initiating a counter signal output by the counter in response to a start signal, wherein the counter signal comprises incremental count values each corresponding to a unit program block write period for each one of the N unit program blocks;
suspending the counter signal in response to a suspend signal;
resuming the counter signal in response to a resume signal; and,
resetting the counter signal after programming an Nth unit program block.

6. The method of claim 2, wherein the PRAM further comprises a write driver circuit adapted to program PRAM memory cells storing data bits associated with the write data block in response to program pulses provided by a program pulse generator; and,
wherein programming of the write data block comprises sequentially programming each one of the N unit program blocks by applying write current to Q of the PRAM memory cells in response to program pulses.

7. The method of claim 6, wherein suspending the program operation after programming M unit program blocks comprises suspending the program pulses after provision of program pulses associated with the Mth unit program block until the counter signal is resumed following execution of the read operation.

8. The method of claim 6, wherein resuming the programming of the write data block comprises providing program pulses associated with an (M+1) unit program block.

9. The method of claim 1, wherein the PRAM comprises an address decoder and a bitline selection circuit operatively connected to a memory cell array including the write data block, and programming the write data block comprises:
by operation of the address decoder, decoding an address of the write data block to select a wordline connected to the write data block, and generating a plurality of bitline selection signals to select bitlines corresponding to the write data block based on the address of the write data block.

10. The method of claim 1, wherein the PRAM further comprises a write driver, and programming the write data block comprises:
providing a plurality of data input signals to the write driver; and,
by operation of the write driver, applying a write current to the selected bitlines based on respective logic levels of the plurality of data input signals.

11. The method of claim 10, wherein applying the write current to the selected bitlines comprises:
for each of the N unit program blocks, applying a plurality of program pulses to the write driver during a corresponding unit program block write period; and,
applying the write current to selected bitlines in response to the plurality of program pulses.

12. The method of claim 11, wherein the program pulses comprise set pulses and reset pulses.

13. The method of claim 11, wherein each unit program block write period comprises a plurality of program pulse intervals, and the method further comprises:
applying more than one program pulse to the write driver during each program pulse interval to simultaneously program multiple PRAM memory cells.

14. The method of claim 11, wherein the write driver comprises:
a pulse selection circuit adapted to receive the program pulses and output a reset pulse or a set pulse in response to a logic level of a data input signal;
a current control circuit adapted to receive a bias voltage and output a control signal with a voltage level based on the logic level of the data input signal; and,
a current drive circuit adapted to output the write current with a level based on the voltage level of the control signal.

15. The method of claim 1, wherein the write data block comprises a plurality of diode-type phase-change memory cells.

16. The method of claim 1, wherein the write data block comprises a plurality of metal-oxide semiconductor (MOS) type phase-change memory cells.

17. The method of claim 1, wherein the PRAM further comprises a sense amplifier, an address decoder, and a bitline selection circuit, wherein executing the requested read operation comprises:
decoding an address of a read data block to select a wordline connected to the read data block, and generating a plurality of bitline selection signals based on the decoded address; and,
by operation of the sense amplifier, sensing the logic state of phase-change memory cells in the read data block.

18. The method of claim 1, wherein the PRAM functions as a random access memory or a mass storage memory for a microprocessor driven appliance.

19. The method of claim 18, wherein the write data block is programmed in response to a program command generated by the microprocessor.

20. The method of claim 1, wherein the PRAM comprises;
a sense amplifier adapted to sense the values of data stored in a read data block during the read operation; and,
a write driver adapted to provide a write current for programming the write data block;
wherein the write driver and the sense amplifier are both connected to a memory array containing the write data block and the read data block via a data line; and,
wherein the method further comprises:
transferring data stored in the read data block to the sense amplifier via the data line during the read operation; and,
providing the write current to the write data block via the data line while programming the write data block.

21. A method of executing a program operation in a phase-change random access memory (PRAM), the method comprising:
programming phase-change memory cells on a unit program block by unit program block basis in response to a sequence of program pulses gated by a counter signal, the counter signal being suspended by a read operation request and resumed upon completion of the read operation.

22. The method of claim 21, wherein a unit program block size is defined in relation to a number of phase-change memory cells receiving write current during a corresponding unit program block write period.

23. The method of claim 21, wherein the PRAM comprises a control unit, and the method further comprises:
applying a start signal from the control unit to the counter to initialize the counter signal;
applying a suspend signal from the control unit to the counter to suspend the counter signal in response to the read operation request;
applying a resume signal from the control unit to the counter to resume programming the phase-change memory cells; and,
applying a finish signal from the control unit to the counter to signal completion of programming the phase-change memory cells.

24. The method of claim 21, wherein the PRAM comprises a program pulse generator and a write driver circuit, and the method further comprises:
by operation of the program pulse generator, applying the program pulses to the write driver circuit in response to the counter signal; and,
by operation of the write driver circuit, applying write current to selected phase-change memory cells in response to the program pulses.

25. The method of claim 24, wherein applying the program pulses to the write driver circuit comprises:
during a program pulse interval within a unit program block write period, applying a reset pulse and a set pulse to the write driver circuit.

26. The method of claim 21, wherein each unit program block is programmed during a corresponding unit program block write period, and the counter signal is suspended upon completion of a unit program block write period in which a counter generating the counter signal receives a suspend signal.

27. A phase-change random access memory (PRAM), comprising:
a memory cell array comprising a plurality of phase-change memory cells programmed by a write current;
a write driver circuit adapted to generate the write current and apply the write current to selected ones of the plurality of phase-change memory cells in response to a sequence of program pulses;
a program pulse generator adapted to generate the sequence of program pulses in response to a counter signal; and,
a counter adapted to provide the counter signal during a program operation, suspend provision of the counter signal during an interrupting read operation interrupting the program operation, and resume provision of the counter signal upon completion of the interrupting read operation.

28. The PRAM of claim 27, further comprising:
a control unit adapted to generate a start signal in response to a program operation request associated with the program operation, a suspend signal in response to a read operation request associated with the interrupting read operation, a resume signal upon completing the interrupting read operation, and a finish signal upon completion of the program operation; and,
wherein the counter is further adapted to initiate the counter signal in response to the start signal, suspend the counter signal in response to the suspend signal, resume the counter signal in response to the resume signal, and reset the counter signal.

29. The PRAM of claim 27, wherein the memory cell array is divided into a plurality of individually accessible memory banks, and the interrupting read operation is directed to data stored in one of the plurality of memory banks being accessed by the program operation.

30. The PRAM of claim 27, further comprising:
a sense amplifier adapted to sense the logic level of data stored in a block of phase-change memory cells in the memory cell array through a sense node connected to a data line used to output the write current from the write driver circuit.

31. The PRAM of claim 27, wherein the phase-change memory cells are diode-type phase-change memory cells.

32. The PRAM of claim 27, wherein the phase-change memory cells are metal-oxide semiconductor (MOS) type phase-change memory cells.

33. The PRAM of claim 28, further comprising:
an address decoder adapted to decode an address of a write data block in the memory cell array;
a bitline selection circuit adapted to receive a plurality of bitline selection signals from the address decoder to select bitlines connected to the write data block.

34. The PRAM of claim 33, wherein the write driver is adapted to provide the write current to phase-change memory cells in the write data block through the selected bitlines in response to the sequence of program pulses.

35. A system, comprising:
a microprocessor receiving input data from an I/O circuit and storing the input data in a non-volatile memory system, the memory system comprising:
a memory cell array comprising a plurality of phase-change memory cells programmed by a write current;
a write driver circuit adapted to generate the write current and apply the write current to selected ones of the plurality of phase-change memory cells in response to a sequence of program pulses;
a program pulse generator adapted to generate the sequence of program pulses in response to a counter signal; and,
a counter adapted to provide the counter signal during a program operation, suspend provision of the counter signal during an interrupting read operation interrupting the program operation, and resume provision of the counter signal upon completion of the interrupting read operation.

36. The system of claim 35, wherein the memory system further comprises:
a control unit adapted to generate a start signal in response to a program operation request associated with the program operation, a suspend signal in response to a read operation request associated with the interrupting read operation, a resume signal upon completing the interrupting read operation, and a finish signal upon completion of the program operation; and,
wherein the counter is further adapted to initiate the counter signal in response to the start signal, suspend the counter signal in response to the suspend signal, resume the counter signal in response to the resume signal, and reset the counter signal.

37. The system of claim 35, wherein the memory cell array is divided into a plurality of individually accessible memory banks, and the interrupting read operation is directed to data stored in one of the plurality of memory banks being accessed by the program operation.

38. The system of claim 35, further comprising:
a sense amplifier adapted to sense the logic level of data stored in a block of phase-change memory cells in the memory cell array through a sense node connected to a data line used to output the write current from the write driver circuit.

39. The system of claim 35, wherein the phase-change memory cells are diode-type phase-change memory cells.

40. The system of claim 35, wherein the phase-change memory cells are metal-oxide semiconductor (MOS) type phase-change memory cells.

41. The system of claim 36, further comprising:
an address decoder adapted to decode an address of a write data block in the memory cell array;
a bitline selection circuit adapted to receive a plurality of bitline selection signals from the address decoder to select bitlines connected to the write data block.

42. The system of claim 41, wherein the write driver is adapted to provide the write current to phase-change memory cells in the write data block through the selected bitlines in response to the sequence of program pulses.

* * * * *